United States Patent
Ito et al.

(10) Patent No.: US 7,501,293 B2
(45) Date of Patent: Mar. 10, 2009

(54) SEMICONDUCTOR DEVICE IN WHICH ZINC OXIDE IS USED AS A SEMICONDUCTOR MATERIAL AND METHOD FOR MANUFACTURING THE SEMICONDUCTOR DEVICE

(75) Inventors: Yoshihiro Ito, Nagaokakyo (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 269 days.

(21) Appl. No.: 10/518,945

(22) PCT Filed: Jun. 4, 2003

(86) PCT No.: PCT/JP03/07055

§ 371 (c)(1),
(2), (4) Date: Jul. 13, 2005

(87) PCT Pub. No.: WO03/107428

PCT Pub. Date: Dec. 24, 2003

(65) Prior Publication Data

US 2006/0054888 A1   Mar. 16, 2006

(30) Foreign Application Priority Data

Jun. 13, 2002   (JP) .............................. 2002-172301

(51) Int. Cl.
*H01L 29/24*   (2006.01)
*H01L 21/00*   (2006.01)

(52) U.S. Cl. ........................... 438/22; 438/85; 438/104; 257/43; 257/102

(58) Field of Classification Search .................... 428/37; 372/43.01; 257/43, 102; 438/85, 104, 22
See application file for complete search history.

(56) References Cited

U.S. PATENT DOCUMENTS 6,735,230 B1 * 5/2004 Tanabe et al. ............ 372/43.01
6,863,943 B2 * 3/2005 Wang et al. .................... 428/37

FOREIGN PATENT DOCUMENTS

EP   1 134 811   9/2001

(Continued)

OTHER PUBLICATIONS

Official communication issued in the corresponding Chinese Application No. 03813676.7, mailed on Jan. 12, 2007.

(Continued)

*Primary Examiner*—Thanh Nguyen
(74) *Attorney, Agent, or Firm*—Keating & Bennett, LLP

(57) ABSTRACT

A semiconductor device having excellent crystallinity and excellent electric characteristics includes a ZnO thin film having excellent surface smoothness. ZnO-based thin films (an n-type contact layer, an n-type clad layer, an active layer, a p-type clad layer, and a p-type contact layer) primarily including ZnO are formed sequentially by an ECR sputtering method or other suitable method on a zinc-polar surface of a ZnO substrate. A transparent electrode and a p-side electrode are formed by an evaporation method or other suitable method on a surface of the p-type contact layer, and an n-side electrode is formed on an oxygen-polar surface of the ZnO substrate.

9 Claims, 7 Drawing Sheets

FOREIGN PATENT DOCUMENTS

| | | |
|---|---|---|
| JP | 05-171435 | 7/1993 |
| JP | 10-306372 | 11/1998 |
| JP | 2000-150900 | 5/2000 |
| JP | 2001-144328 | 5/2001 |
| JP | 2001-244464 | 9/2001 |
| JP | 2002-319682 | 10/2002 |
| JP | 2002-326895 | 11/2002 |

OTHER PUBLICATIONS

N. Ohashi et al.; "Bonding of Zinc Oxide Crystals doped with Transition Metal Ions"; Extended abstracts of 59th meeting; The Japan Society of Applied Physics, Hiroshima University, Sep. 1998; p. 228.

K. Ogata et al.; "Homoepitaxial growth of ZnO on ZnO substrate by MOVPE"; Extended abstracts of 49th meeting, The Japan Society of Applied Physics; Shonan Campus, Tokai University; Mar. 2002; p. 318.

Yutaka Ohya et al., "Thin Film Transistor of ZnO Fabricated by Chemical Solution Deposition", Jpn. J. Appl. Phys., vol. 40 (2001), pp. 297-298, Part 1, No. 1, Jan. 2001.

K. Yamaya et al., "Use of Helicon-Wave Excited Plasma for Aluminum-Doped ZnO Thin-Film Sputtering", Appl. Phys. Lett. 72 (2), Jan. 12, 1998, pp. 235-237.

S.K. Hong et al., "ZnO and Related Materials: Plasma-Assisted Molecular Beam Epitaxial Growth, Charaterization, and Application", Journal of Electronic Materials, Vo. 30, No. 6, 2001, pp. 647-658.

Shen Zhu et al., "Polarity Effects of Substrate Surface in Homoepitaxial ZnO Film Growth", Journal of Crystal Growth 219 (2000), pp. 361-367.

Yefan Chen et al., "Morphology Evolution of ZnO (000 1) Surface During Plasma-Assisted Molecular-Beam Epitaxy", Applied Physics Letters, vol. 80, No. 8, Feb. 2002, pp. 1358-1360.

Soon-Ku Hong et al., "Control of Poloarity of ZnO Films Grown by Plasma-Assisted Molecular-Beam Epitaxy: Zn- and O-Polar ZnO Films on Ga-Polar and GaN Templates", Applied Physics Letters, vol. 77, No. 22, Nov. 2000, pp. 3571-3573.

* cited by examiner

SEMICONDUCTOR DEVICE IN WHICH ZINC OXIDE IS USED AS A SEMICONDUCTOR MATERIAL AND METHOD FOR MANUFACTURING THE SEMICONDUCTOR DEVICE

BACKGROUND OF THE INVENTION

1. Field of the Invention

The present invention relates to a semiconductor device and a method for manufacturing the semiconductor device. In particular, the present invention relates to a semiconductor device in which zinc oxide is used as a semiconductor material and to a method for manufacturing the semiconductor device.

2. Description of the Related Art

Zinc oxide (ZnO) is one type of II-VI compound semiconductor. The band gap energy of ZnO can be changed by making ZnO into a mixed crystal with MgO, CdO, or other suitable materials, and ZnO can have a multilayer structure of quantum well and other suitable structures. Furthermore, since the bond energy of an exciton is very large, ZnO is suitable for use in light-emitting devices. Since ZnO is transparent in the visible range, ZnO is also suitable for use in transparent thin film transistors for driving liquid crystal displays.

Meanwhile, ZnO has a wurtzite structure (hexagonal system). As shown in FIG. 9, ZnO has no center of symmetry in the c axis direction (vertical direction) and has polarity based on a molecular structure.

That is, ZnO has zinc-polarity (+c polarity) in which three bonds bonding to a Zn atom 51 point downward and three bonds bonding to an oxygen atom 52 point upward, as shown in FIG. 9($a$), and oxygen-polarity (−c polarity) in which three bonds bonding to a Zn atom 51 point upward and three bonds bonding to an oxygen atom 52 point downward, as shown in FIG. 9($b$).

Here, the above-described polarity refers to an orientation of the above-described bond and does not refer to an element terminating the surface.

It has been reported that a ZnO thin film having the oxygen-polarity was previously formed by a PMBE (plasma-assisted molecular-beam epitaxy) method on a sapphire substrate (APPLIED PHYSICS LETTERS, Vol. 80, No. 8, pp. 1358-1360 (2002); hereafter referred to as "first known technology").

It has been reported that a film of GaN having Ga-polarity was formed on a sapphire substrate and, by controlling the film formation conditions, a ZnO thin film having the zinc-polarity or the oxygen-polarity was formed on the above-described GaN (APPLIED PHYSICS LETTERS, Vol. 77, No. 22, pp. 3571-3573 (2000); hereafter referred to as "second known technology").

In addition, another technology has been reported, in which the polarity of a piezoelectric film of ZnO formed on a substrate was able to be specified (Japanese Unexamined Patent Application Publication No. 2001-144328; hereafter referred to as "third known technology"), as another known technology.

In the above-described third known technology, a piezoelectric film (ZnO film) having a + surface (zinc-polarity) or a − surface (oxygen-polarity) can be formed in accordance with the type of substrate, and the polarity of the piezoelectric film of ZnO formed on a substrate is controlled by changing the film formation conditions, e.g., a heating temperature of the substrate.

With respect to the above-described first known technology, it has been determined by Coaxial Impact Collision Ion Scattering Spectroscopy (CAICISS) that the ZnO thin film formed on the sapphire substrate has oxygen-polarity. However, substantially hexagonal crystal grains remain in such a ZnO film, the surface shape becomes uneven and, thereby, the desired surface smoothness of the ZnO thin film cannot be obtained.

That is, since the ZnO thin film formed by the first known technology has poor surface smoothness, where a semiconductor device is formed using the ZnO thin film, a current passes through grain boundaries, and a concentration of electric field occurs on convex portions of crystal grains. Consequently, the operation of the device may become unstable, or the device may be destroyed.

According to the second known technology, the polarity of the ZnO thin film can be controlled by changing the film formation conditions. In this manner, the ZnO thin film having the zinc-polarity or the oxygen-polarity can be formed on GaN. However, the substrate temperature increases during the film formation of ZnO on GaN and, thereby, Ga, which is an element of GaN, may diffuse into the ZnO thin film.

Since Ga functions as a donor to ZnO, if Ga diffuses into the ZnO thin film, the resistance of ZnO is reduced.

Furthermore, it is difficult to control the above-described diffusion and, therefore, variations may occur in the device characteristics of the semiconductor device.

In the above-described second known technology, since there is lattice mismatch between GaN and ZnO, lattice defects are introduced to mitigate the lattice mismatch. As a result, the crystallinity of the ZnO thin film is deteriorated and, thereby, deterioration of the electric characteristics occurs.

The above-described third known technology discloses the formation of the piezoelectric thin film having the zinc-polarity or the oxygen-polarity. However, there is no disclosure with respect to the influence exerted by the polarity on the surface shape and the electric characteristics of the thin film. Furthermore, since the material for the substrate is different from the material for the piezoelectric film, deterioration of the crystallinity may occur due to the lattice mismatch as in the second known technology, and there is a problem in that highly reliable, desirable, and excellent electric characteristics cannot be obtained.

SUMMARY OF THE INVENTION

To overcome the problems described above, preferred embodiments of the present invention provide a semiconductor device, which is provided with a ZnO thin film having excellent surface smoothness and which has excellent crystallinity and excellent electric characteristics, and a method for manufacturing the semiconductor device.

The inventors of the present invention conducted intensive research in order to obtain a ZnO thin film having excellent surface smoothness. As a result, it was discovered that a semiconductor device having excellent surface smoothness and crystallinity and excellent electric characteristics could be obtained by forming a ZnO thin film on a zinc-polar surface of a single crystal substrate, primarily including zinc oxide.

A semiconductor device according to a preferred embodiment of the present invention includes a single crystal substrate primarily including zinc oxide which has a zinc-polar surface and an oxygen-polar surface and at least one layer of thin film primarily including zinc oxide is disposed on the above-described zinc polar surface. In this manner, a thin film having excellent surface smoothness and crystallinity is produced.

The inventors of the present invention examined the polarity of the above-described thin film, and it was confirmed that the thin film had zinc-polarity.

Therefore, the semiconductor device according to a preferred embodiment of the present invention includes the above-described thin film having the zinc-polarity. That is, a ZnO-based thin film formed on a zinc-polar surface of a ZnO substrate has the zinc-polarity.

In the semiconductor device according to preferred embodiments of the present invention, the above-described thin film is composed of a multilayer film, and the multilayer film defines a light-emitting layer or a switching portion.

Specifically, the above-described thin film is composed of the multilayer film, the multilayer film defines the light-emitting layer and, therefore, the light-emitting layer has excellent surface smoothness and crystallinity. Consequently, a light-emitting device, e.g., LED and LD, having excellent electric characteristics is obtained.

Alternatively, the above-described thin film is composed of the multilayer film, the multilayer film defines the switching portion and, therefore, even when light is applied to an active layer, changes in the electrical conductivity are minimized. Consequently, semiconductor devices, e.g., TFT, capable of preventing deterioration of the characteristics of the switching element are readily obtained.

Since the above-described semiconductor device is provided with a ZnO-based multilayer film having excellent surface smoothness and crystallinity, semiconductor devices, e.g., light-emitting elements and thin film transistors, having excellent electric characteristics are readily obtained.

A method for manufacturing a semiconductor device according to preferred embodiments of the present invention includes the steps of determining whether a surface of a single crystal substrate primarily including zinc oxide is a zinc-polar surface or an oxygen-polar surface, and forming at least one layer of thin film primarily including zinc oxide on the above-described zinc-polar surface.

According to the above-described manufacturing method, a desired ZnO-based thin film is readily and reliably formed on the zinc-polar surface of the zinc oxide substrate.

That is, after determining whether the surface of the ZnO substrate is a zinc-polar surface or an oxygen-polar surface, at least one layer of thin film primarily including ZnO is formed on the above-described zinc-polar surface. Since the above-described ZnO thin film has zinc-polarity, the ZnO-based thin film is readily formed on the zinc-polar surface.

The semiconductor device according to preferred embodiments of the present invention is preferably formed using a sputtering apparatus provided with a plasma generation chamber and a film formation chamber. A sputtering treatment is performed using the sputtering apparatus so as to form the above-described thin film.

According to the above-described manufacturing method, since the film is formed by the sputtering treatment, a semiconductor device having desired electric characteristics is obtained inexpensively. Furthermore, since the plasma generation chamber and the film formation chamber are separated, plasma damage to the semiconductor device is minimized.

Preferably, the above-described sputtering treatment is performed by any method selected from an electron cyclotron resonance plasma sputtering method, an inductively coupled plasma sputtering method, a helicon wave excited plasma sputtering method, an ion beam sputtering method, and a cluster beam sputtering method. Alternatively, the above-described thin film is performed preferably by any method selected from among a molecular-beam epitaxy method, a metal organic chemical vapor deposition method, a laser molecular-beam epitaxy method, and a laser abrasion method.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Preferred embodiments of the present invention will be described below in detail with reference to the drawings.

Figure 1:
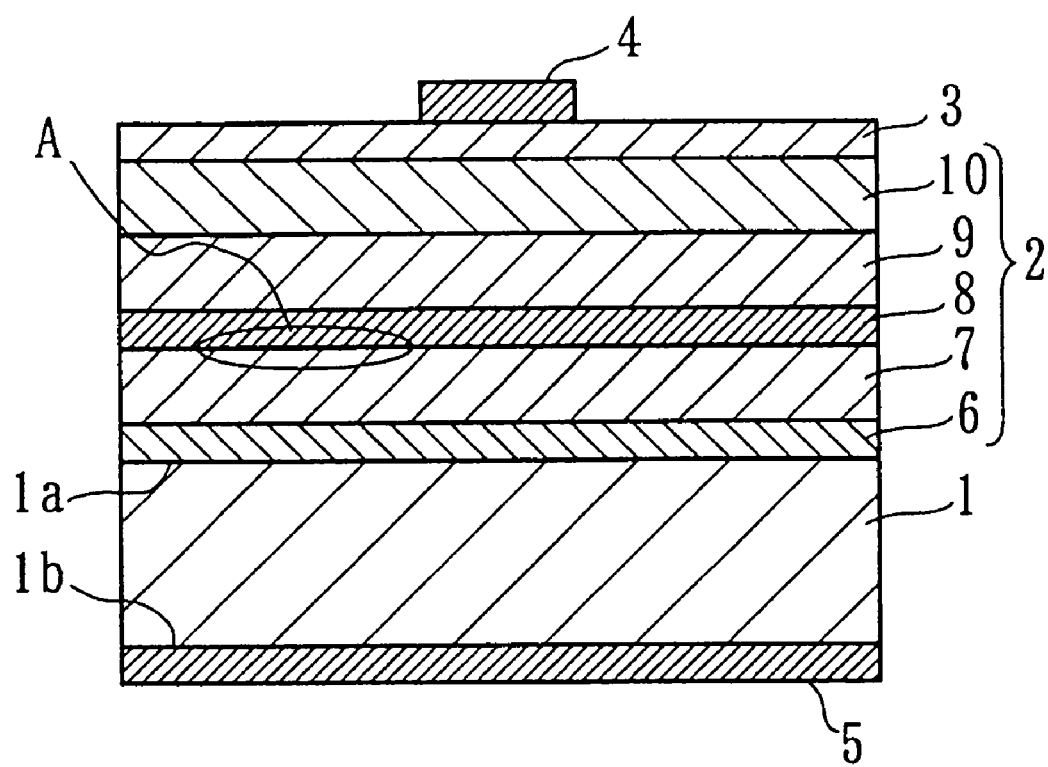
FIG. 1 is a schematic sectional view of a first preferred embodiment of a semiconductor device according to the present invention.

FIG. 1 is a schematic sectional view of a Light Emitting Diode (hereafter referred to as "LED") as a first preferred embodiment of a semiconductor device according to the present invention.

In FIG. 1, reference numeral 1 denotes a single crystal substrate primarily including electrically conductive ZnO having an n-type conduction form (hereafter referred to as "ZnO substrate"), and the ZnO substrate 1 has a zinc-polar surface 1a and an oxygen-polar surface 1b.

In the LED, a light-emitting layer 2 is disposed on the zinc-polar surface 1a of the ZnO substrate 1, and a transparent electrode 3 made of Indium Tin Oxide (hereafter referred to as "ITO") and having a film thickness of about 150 nm is disposed on the surface of the light-emitting layer 2. Furthermore, a p-side electrode 4 having a total film thickness of about 300 nm is disposed on a substantially central portion of the surface of the transparent electrode 3, while a Ni film, an Al film, and a Au film are laminated sequentially in the p-side electrode 4.

An n-side electrode 5 having a total film thickness of about 300 nm is disposed on the oxygen-polar surface 1b of the ZnO substrate 1, while a Ti film and a Au film are laminated sequentially in the n-side electrode 5.

Specifically, the above-described light-emitting layer 2 includes a multilayer film in which an n-type contact layer 6, an n-type clad layer 7, an active layer 8, a p-type clad layer 9, and a p-type contact layer 10 are laminated sequentially. That is, the active layer 8 is disposed between the n-type clad layer 7 and the p-type clad layer 9, the n-type clad layer 7 is connected to the n-side electrode 5 with the n-type contact layer 6 and the ZnO substrate 1 therebetween, and the p-type clad layer 9 is connected to the transparent electrode 3 with the p-type contact layer 10 therebetween.

The active layer 8 is formed from $Cd_xZn_{1-x}O$ (where x satisfies 0≦x<1, and is about 0.1, for example) which is a mixed crystal of CdO and ZnO and which has a film thickness of about 200 nm.

The active layer 8 emits light by recombination of an electron which is an n-type carrier and a hole which is a p-type carrier, and the wavelength of the emitted light is determined by the band gap energy.

Since carriers must be effectively confined in the active layer 8, the n-type clad layer 7 and the p-type clad layer 9 have a band gap energy that is greater than that of the above-described active layer 8, and are composed of $Mg_yZn_{1-y}O$ (where y satisfies 0≦y<1, and is about 0.2, for example) which is a mixed crystal of MgO and ZnO. The n-type clad layer 7 has a film thickness of about 2,000 nm, and the p-type clad layer 9 has a film thickness of about 600 nm.

Both the n-type contact layer 6 and the p-type contact layer 10 are formed from ZnO and have a film thickness of about 200 nm.

A method for manufacturing the above-described LED will be described below.

Initially, a ZnO single crystal is prepared by a SCVT (Seeded Chemical Vapor Transport) method or other suitable method. A surface perpendicular to the c axis direction of the crystal axis is cut from the ZnO single crystal and is subjected to mirror polishing, such that a ZnO substrate is prepared and the polarity thereof is checked.

Examples of known methods for determining the polarity of a compound semiconductor, e.g., ZnO, having a piezoelectric property include a Coaxial Impact Collision Ion Scattering Spectroscopy (CAICISS) method (APPLIED PHYSICS LETTERS, Vol. 72, (1998), p. 824), a Convergent Beam Electron Diffraction (CBED) method (APPLIED PHYSICS LETTERS, Vol. 69, (1996), p. 337), and a Scanning Nonlinear Dielectric Microscopy (SNDM) method (Sentangijutsu Symposium, "Atsudenzairyoto Danseiha Device," (High Technology Symposium, "Piezoelectric Material and Elastic Wave Device"), (February, 2000) pp. 23-30). In the present preferred embodiment, the polarity of the ZnO substrate is checked by the SNDM (Scanning Nonlinear Dielectric Microscopy) method.

That is, in the SNDM, when a potential is applied while a probe scans the ZnO substrate 1, an intensity signal incorporating the polarity of the ZnO substrate 1 is detected.

On the other hand, when the applied potential is "0", since the potential is not applied, no intensity signal incorporating the polarity is detected.

In the SNDM method, when a potential is applied to the ZnO substrate 1, the intensity signal is displaced to the + side or the − side as compared to when the applied potential is "0".

Therefore, in the SNDM method, the intensity at an applied potential of "0" is taken as the reference signal, and the intensity signal when a potential is applied while the probe scans the ZnO substrate 1 is taken as the polarity signal. Then, the polarity of the ZnO substrate is determined based on the displacement of the polarity signal toward the + side or the − side relative to the reference signal.

In the present preferred embodiment, the displacement of the polarity signal toward the − side relative to the reference signal indicates the + polarity (zinc-polarity), and the displacement of the polarity signal toward the + side relative to the reference signal indicates the − polarity (oxygen-polarity) based on the configuration of the SNDM.

Figure 2A:
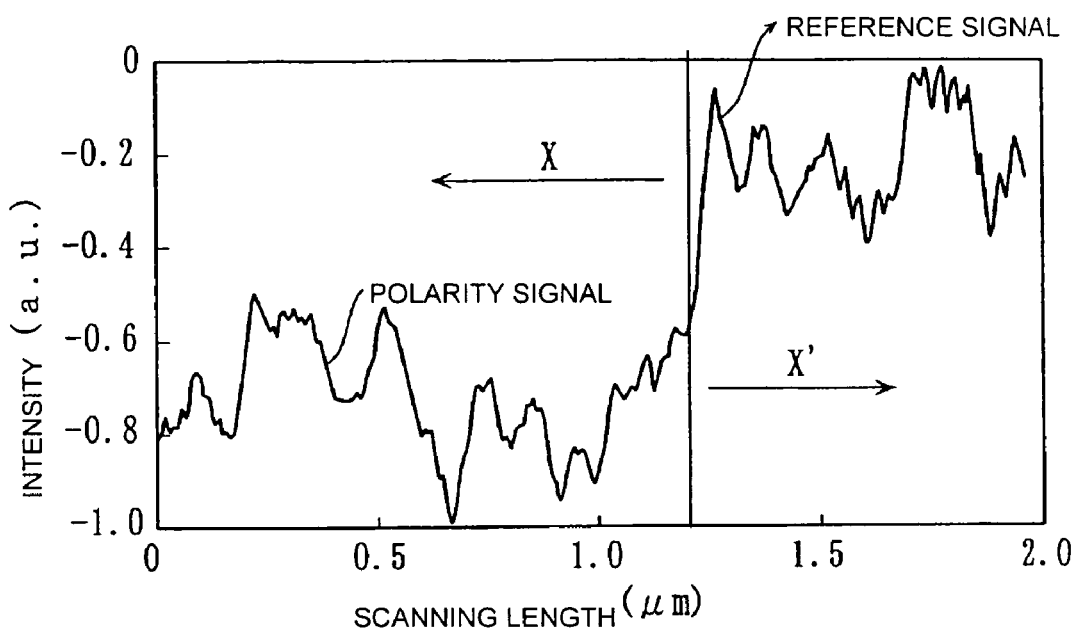
FIGS. 2A and 2B are diagrams showing polar characteristics of ZnO.
Figure 2B:
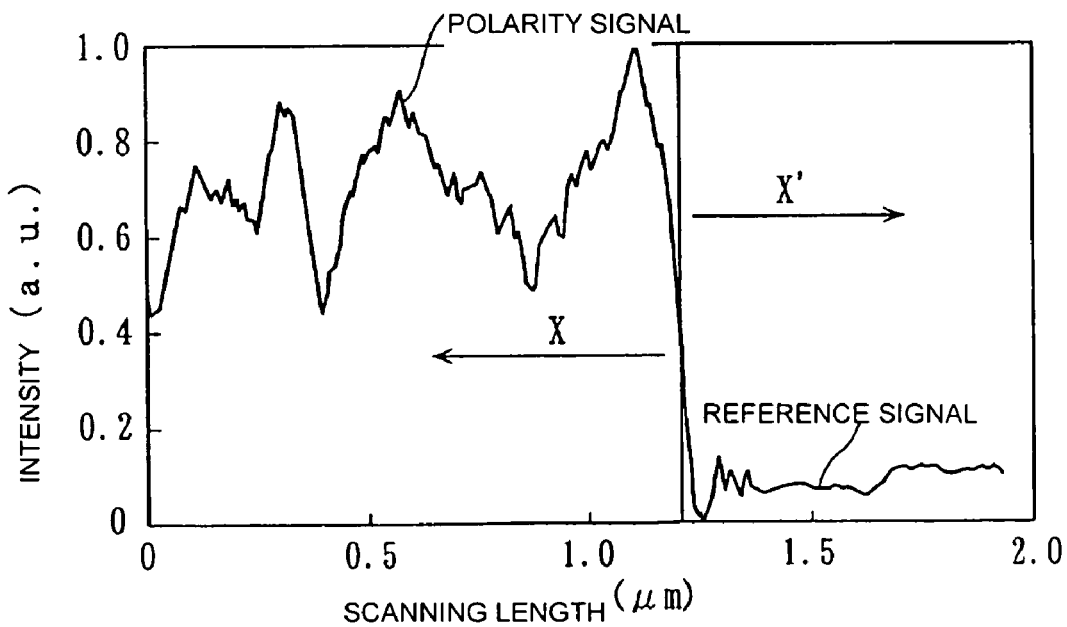

FIGS. 2(a) and 2(b) are diagrams showing the polar characteristics of the ZnO substrate 1. The horizontal axis indicates the scanning length (μm), and the vertical axis indicates the intensity (a.u. indicates arbitrary unit).

In FIGS. 2(a) and 2(b), the direction indicated by the arrow X represents the polarity signal of the ZnO substrate 1, and the direction indicated by the arrow X' represents the reference signal when no potential is applied.

Therefore, when the polarity signal is displaced toward the − side relative to the reference signal as shown in FIG. 2(a), the polar surface of the ZnO substrate 1 is a zinc-polar surface, and when the polarity signal is displaced toward the + side relative to the reference signal as shown in FIG. 2(b), the polar surface of the ZnO substrate 1 is an oxygen-polar surface.

After the polarity of the ZnO substrate 1 is determined as described above, a ZnO thin film is laminated on the zinc-polar surface 1a of the ZnO substrate 1 by an Electron Cyclotron Resonance (hereafter referred to as "ECR") sputtering apparatus.

That is, the ECR sputtering apparatus having a plasma generation chamber and a separate film formation chamber is provided, the ZnO substrate 1 is disposed at a predetermined position in the film formation chamber with the zinc-polar surface 1a facing up, and the ZnO substrate 1 is heated to a temperature of about 300° C. to about 800° C.

Subsequently, a reactive gas, e.g., oxygen, and a plasma generation gas, e.g., argon, are supplied to the plasma generation chamber, and a microwave is discharged at a frequency (e.g., about 2.45 GHz) at which resonance occurs in the cyclotron, such that plasma is generated in the plasma generation chamber.

Thereafter, a high-frequency power (for example, about 150 W) is applied to a sputtering target, and a sputtering target substance (ZnO) is sputtered using the plasma generated in the plasma generation chamber, such that the n-type contact layer 6 made of ZnO is formed on the surface of the ZnO substrate 1 by reactive sputtering.

Next, the reactive sputtering is performed using a target produced by sintering MgO and ZnO at a desired mixing ratio, such that the n-type clad layer 7 made of $Mg_yZn_{1-y}O$ (where 0≦y<1) is formed.

Likewise, the reactive sputtering is performed, and the active layer 8 made of $Cd_xZn_{1-x}O$ (where 0≦x<1), the p-type clad layer 9 made of $Mg_yZn_{1-y}O$ (where 0≦y<1), and the p-type contact layer 10 made of ZnO are formed sequentially.

The film thickness of each thin film is set at a desired film thickness by controlling the reaction time.

The Ti film and the Au film are formed sequentially on the surface of the oxygen-polar surface 1b of the ZnO substrate 1 so as to form the n-side electrode 5 by an evaporation method, the ITO film is formed on the surface of the p-type contact layer 10 by the evaporation method so as to form the transparent electrode 3 and, thereafter, Ni, Al, and Au are laminated sequentially so as to form the p-side electrode 4.

Figure 3:
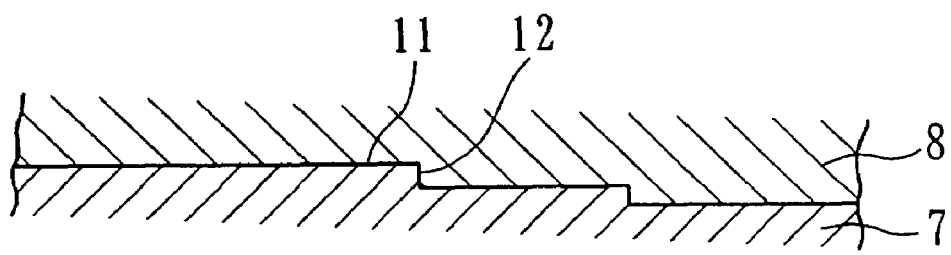
FIG. 3 is a sectional view schematically showing the surface shape of a ZnO thin film formed on a zinc-polar surface of a ZnO substrate.

As described above, in the first preferred embodiment, the light-emitting layer 2 composed of a ZnO-based multilayer film is formed on the zinc-polar surface 1a of the ZnO substrate 1 and, thereby, ZnO-based thin films having excellent surface smoothness are laminated sequentially. As a result, the surface of the n-type clad layer 7 becomes a thin film including a smooth terrace 11 and a linear step 12, as shown in FIG. 3 (magnified diagram of a portion A shown in FIG. 1), and having excellent surface smoothness. Therefore, any crystal grain and any uneven portion are eliminated from the surface, and the ZnO thin film having excellent surface smoothness is obtained.

The thin film having excellent surface smoothness, as shown in FIG. 3, can be obtained with respect to not only the n-type clad layer 7, but also the n-type contact layer 6, the active layer 8, the p-type clad layer 9, and the p-type contact layer 10 in a similar manner.

Since the above-described ZnO-based thin films have excellent surface smoothness as described above, no current passes through grain boundaries, and a concentration of electric field on the surface of the ZnO film does not occur. Consequently, no scattering occurs during movement of electrons, and an LED having high mobility of electron, excellent crystallinity, and excellent electric characteristics is obtained.

In the above-described first preferred embodiment, since the ECR sputtering apparatus is used and the ZnO-based thin films are formed by the sputtering treatment, no expensive apparatus is required to be separately provided, and thus, the thin film formation is performed inexpensively.

Furthermore, since the plasma generation chamber and the film formation chamber are separated, plasma damage to the ZnO thin film is minimized, and a thin film having good quality is obtained.

In the present preferred embodiment, the polarity of the ZnO thin film formed on the surface of the ZnO substrate 1 was further examined by the use of the SNDM.

That is, the sensitivity of the SNDM in the depth direction is determined based on the probe end radius of the probe and the dielectric constant of the sample, ZnO. In the case of ZnO, the detectable range in the depth direction is substantially equal to the probe end radius of the probe. Therefore, by making the above-described probe end radius smaller than the film thickness, the polarity of the ZnO thin film can be determined regardless of the polarity of the ZnO substrate 1 which defines the base.

Figure 4:
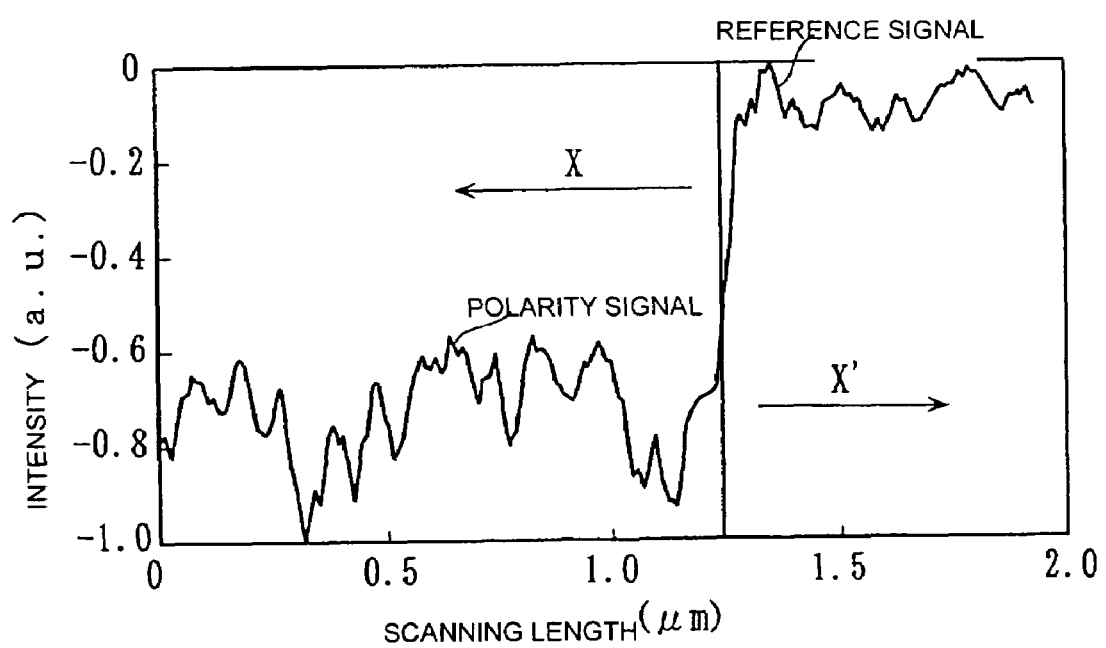
FIG. 4 is a diagram showing polar characteristics of a ZnO thin film formed on the zinc-polar surface of the ZnO substrate.

FIG. 4 is a diagram showing the polar characteristics of the ZnO thin film. As in FIGS. 2(a) and 2(b), the horizontal axis indicates the scanning length (μm), the vertical axis indicates the intensity (a.u.), the direction indicated by an arrow X represents the polarity signal of the ZnO substrate 1, and the direction indicated by an arrow X' represents the reference signal when no potential is applied.

As shown in FIG. 4, since the polarity signal is displaced toward the − side relative to the reference signal, the ZnO thin film has the zinc-polarity. That is, the ZnO-based thin film formed on the zinc-polar surface of the ZnO substrate 1 has the zinc-polarity.

In the present preferred embodiment, a double heterostructure is used for the light-emitting layer 2, in which the active layer 8 is disposed between the p-type clad layer 9 and the n-type clad layer 7. However, a pn junction structure, an MIS (Metal-Insulating layer-Semiconductor layer) structure, or a single heterostructure may be used.

Figure 5:
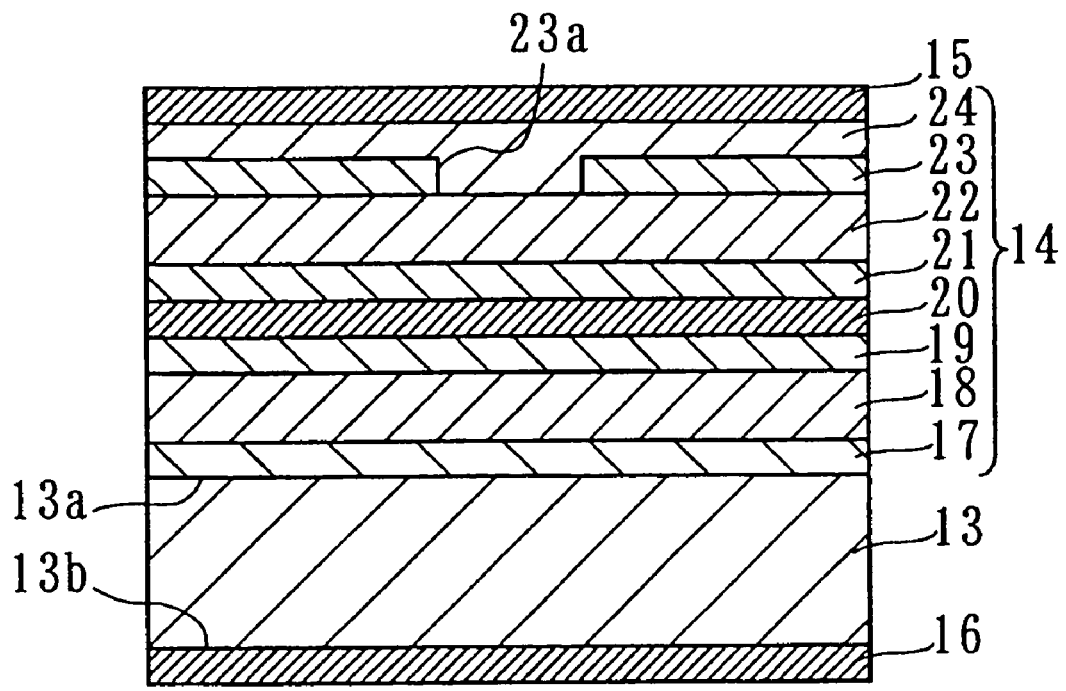
FIG. 5 is a schematic sectional view of a second preferred embodiment of the semiconductor device according to the present invention.

FIG. 5 is a schematic sectional view of a Laser Diode (hereafter referred to as "LD") as a second preferred embodiment of the semiconductor device according to the present invention.

In the LD, a light-emitting layer 14 is disposed on a zinc-polar surface 13a of a ZnO substrate 13 having electrical conductivity, and a p-side electrode 15 having a total film thickness of about 300 nm is disposed on the surface of the light-emitting layer 14, while a Ni film, an Al film, and a Au film are laminated sequentially in the p-side electrode 15.

An n-side electrode 16 having a total film thickness of about 300 nm is disposed on an oxygen-polar surface 13b of the ZnO substrate 13, while a Ti film and a Au film are laminated sequentially in the n-side electrode 16.

Specifically, the above-described light-emitting layer 14 is composed of a multilayer film in which an n-type contact layer 17, an n-type clad layer 18, an n-type light guide layer 19, an active layer 20, a p-type light guide layer 21, a p-type clad layer 22, a current limiting layer 23, and a p-type contact layer 24 are sequentially laminated.

That is, the active layer 20 is disposed between the n-type clad layer 18 and the p-type clad layer 22 with the n-type guide layer 19 and the p-type guide layer 21 therebetween, respectively.

The n-type clad layer 18 is connected to the n-side electrode 16 with the n-type contact layer 17 and the Zno substrate 13 therebetween, and the p-type clad layer 22 is connected to the p-side electrode 15 with the current limiting layer 23 and the p-type contact layer 24 therebetween.

Specifically, the active layer 20 has a multi-quantum well structure in which 2 to 5 layers of a barrier layer composed of $Mg_yZn_{1-y}O$ (where y satisfies $0 \leq y < 1$, and is about 0.1, for example) and a well layer composed of $Cd_xZn_{1-x}O$ (where x satisfies $0 \leq x < 1$, and is about 0.1, for example), each having a thickness of about 3 nm, are alternately laminated.

When the refractive index of the active layer 20 is greater than those of the n-type clad layer 18 and the p-type clad layer 22, the light is confined in the active layer 20. However, when the light is not adequately confined since the active layer 20 is a thin film, the leakage of the light from the active layer 20 must be prevented. Consequently, the n-type light guide layer 19 having a refractive index between those of the n-type clad layer 18 and the active layer 20 is interposed between the active layer 20 and the clad layer 18, and the p-type light guide layer 21 having a refractive index between those of the p-type clad layer 22 and the active layer 20 is interposed between the active layer 20 and the clad layer 22 to define a portion of an optical waveguide.

The n-type contact layer 17 having a film thickness of about 1,500 nm and made of ZnO is disposed on the zinc-polar surface 13a of the ZnO substrate 13. The n-type clad layer 18 having a film thickness of about 2,000 nm and made of $Mg_yZn_{1-y}O$ (where y satisfies $0 \leq y < 1$, and is about 0.2, for example) is disposed on the surface of the n-type contact layer 17. Furthermore, the n-type light guide layer 19 having a film thickness of about 40 nm and made of ZnO is disposed on the surface of the n-type clad layer 18.

The active layer 20 having the above-described multi-well type structure is laminated on the surface of the n-type light guide layer 19. The p-type light guide layer 21 having a film thickness of about 40 nm and made of $Mg_yZn_{1-y}O$ (where y satisfies $0 \leq y < 1$, and is about 0.2, for example) is disposed on the surface of the active layer 20. Furthermore, the p-type clad layer 22 having a film thickness of about 2,000 nm and made of $Mg_yZn_{1-y}O$ (where y satisfies $0 \leq y < 1$, and is about 0.2, for example) is disposed on the surface of the p-type light guide layer 21.

In addition, in order to pass a current only through an oscillation region, the current limiting layer 23 having a film thickness of about 400 nm and made of $Mg_yZn_{1-y}O$ (where y satisfies $0 \leq y < 1$, and is about 0.2, for example) is disposed on the surface of the p-type clad layer 22 and has a predetermined shape having a groove portion 23a. The p-type contact layer 24 is disposed on the surface of the p-type clad layer 22 so as to have a cross section in the shape of a letter T while covering the current limiting layer 23.

The above-described LD is also produced by a method and procedure substantially similar to that in the first preferred embodiment of the present invention.

That is, initially, a ZnO single crystal is prepared by the SCVT method or other suitable method. A surface perpendicular to the c axis direction of the crystal axis is cut from the ZnO single crystal and is subjected to mirror polishing, such that a ZnO substrate is prepared and the polarity thereof is checked by the SNDM.

Thereafter, as in the first preferred embodiment, the ECR sputtering apparatus is prepared, the ZnO substrate 13 is disposed at a predetermined position in a film formation chamber with the zinc-polar surface 13a up, and the ZnO substrate 1 is heated to a temperature of about 300° C. to about 800° C.

Subsequently, the reactive gas, e.g., oxygen, and the plasma generation gas, e.g., argon, are supplied to the plasma generation chamber, and a microwave is discharged, such that plasma is generated in the plasma generation chamber. A sputtering target substance (ZnO) is sputtered, and the n-type contact layer 17 made of ZnO is formed on the surface of the ZnO substrate 13 by reactive sputtering.

Likewise, the reactive sputtering is performed while the target substance is appropriately changed to a desired substance, and the n-type contact layer 17, the n-type clad layer 18, the n-type light guide layer 19, the active layer 20, the n-type light guide layer 21, the p-type clad layer 22, and the current limiting layer 23 are sequentially formed.

After the current limiting layer 23 is formed, the resulting ZnO substrate 13 provided with the films is temporarily taken out of the sputtering apparatus. A photoresist is applied to the surface of the above-described current limiting layer 23, the resist film is patterned by a known photolithographic technology, and an etching treatment is performed with an alkaline solution, e.g., NaOH, such that the current limiting layer 23 is formed into a predetermined shape.

The above-described ZnO substrate 13 is again disposed at the predetermined position in the ECR sputtering apparatus, and the reactive sputtering is performed, such that the film of p-type contact layer 24 made of ZnO is formed to have a cross section in the shape of a letter T.

Thereafter, as in the first preferred embodiment, the Ti film and the Au film are sequentially formed on the surface of the oxygen-polar surface 13b of the ZnO substrate 13 so as to form the n-side electrode 16 by an evaporation method, and Ni, Al, and Au are sequentially laminated on the surface of the p-type contact layer 24 by the evaporation method so as to form the p-side electrode 15.

As described above, in the second preferred embodiment, the light-emitting layer 14 composed of a ZnO-based multi-layer thin film is formed on the zinc-polar surface 13a of the ZnO substrate 13 as in the first preferred embodiment. Therefore, ZnO-based thin films having a smooth terrace and a linear step are obtained. In this manner, since excellent surface smoothness is provided, no current passes through grain boundaries, a concentration of electric field on the surface of the ZnO film does not occur. Consequently, no scattering occurs during movement of electrons, the mobility of electron becomes high, and the crystallinity becomes excellent, such that an LD having excellent electric characteristics is obtained.

In the above-described second preferred embodiment, as in the first preferred embodiment, since the ECR sputtering apparatus is used and the ZnO-based thin films are formed by the sputtering treatment, no expensive apparatus is required to be separately provided, and the thin film formation is performed inexpensively. Furthermore, since the plasma generation chamber and the film formation chamber are separated, plasma damage to the ZnO thin film is minimized, and a thin film having good quality is obtained.

Figure 6:
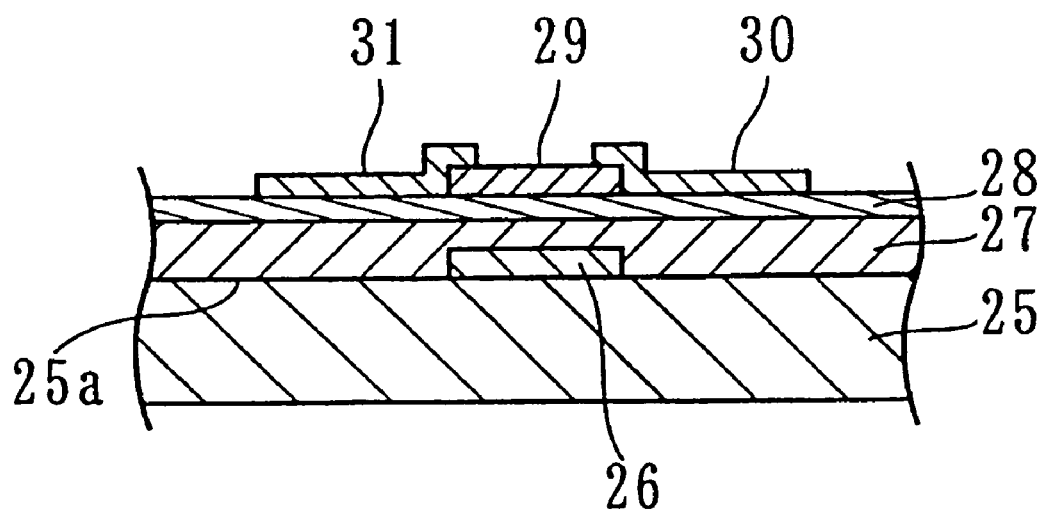
FIG. 6 is a schematic sectional view of a preferred third embodiment of the semiconductor device according to the present invention.

FIG. 6 is a schematic sectional view of a Thin Film Transistor (hereafter referred to as "TFT") as a third preferred embodiment of the semiconductor device according to the present invention. The TFT preferably includes an insulating ZnO substrate 25, a gate electrode 26 having a film thickness of about 50 nm and disposed on a substantially central portion of the ZnO substrate 25, a gate insulating layer 27 having a film thickness of about 200 nm and disposed on the ZnO substrate 25 while covering the gate electrode 26, an active layer 28 having a film thickness of about 50 nm and disposed on the gate insulating layer 27, a channel protective layer 29 having a film thickness of about 200 nm and disposed on a substantially central portion of the active layer 28, and a source electrode 30 and a drain electrode 31 which are disposed so as to cover a portion of the channel protective layer 29 and which have film thicknesses of about 200 nm.

In the above-described TFT, a switching portion includes constituents other than the ZnO substrate 25, that is, the gate electrode 26, the gate insulating layer 27, the active layer 28, the channel protective layer 29, the source electrode 30, and the drain electrode 31. The switching portion defined by these elements is disposed on a zinc-polar surface 25a of the ZnO substrate 25.

The gate electrode 26, the source electrode 30, and the drain electrode 31 have low resistances since ZnO is doped with Ga, and the gate insulating layer 27 and the channel protective layer 29 have high resistances since ZnO is doped with Ni.

The active layer 28 is made of a non-doped ZnO thin film. The oxygen concentration in the thin film is adjusted by controlling the oxygen partial pressure during the formation of thin film and, thereby, the active layer 28 is formed to have n-type conduction.

The above-described TFT can also be readily produced using the ECR sputtering and the photolithographic technology substantially similar to that in the first and second preferred embodiments of the present invention.

That is, the ZnO substrate is prepared and, thereafter, the polarity is determined. Subsequently, the ECR sputtering apparatus is used, and the reactive sputtering is performed while Ga-doped ZnO is provided as a target substance, such that a ZnO film (ZnO:Ga) is formed on a zinc-polar surface 25a of the ZnO substrate 25.

The resulting ZnO substrate 25 is removed from the ECR sputtering apparatus. A photoresist is applied to the above-described ZnO film, the resist film is patterned by a known photolithographic technology and, thereafter, an etching treatment is performed with an alkaline solution, e.g., NaOH, such that the gate electrode 26 is formed.

The reactive sputtering is performed while Ni-doped ZnO is provided as a target substance, the gate insulating layer 27 is formed on the ZnO substrate 25 so as to cover the gate electrode. Subsequently, the reactive sputtering is performed while non-doped ZnO is provided as a target substance and the oxygen partial pressure is controlled, such that the active layer 28 is formed.

Then, the reactive sputtering is performed while Ni-doped ZnO is provided as a target substance, such that a ZnO film (ZnO:Ni film) is formed. A photoresist is applied to the resulting ZnO film as described above, the resist film is patterned by the photolithographic technology and, thereafter, the etching treatment is performed with an alkaline solution, e.g., NaOH, such that the channel protective layer 29 is formed.

Subsequently, the reactive sputtering is performed while Ga-doped ZnO is provided as a target substance, a photoresist is applied to the resulting ZnO:Ga film as described above, the resist film is patterned by the photolithographic technology, and thereafter, the etching treatment is performed with an alkaline solution, e.g., NaOH, such that the source electrode 30 and the drain electrode 31 are formed.

As described above, in the third preferred embodiment, since the TFT is formed from a ZnO-based multilayer film, even when the active layer 28 is exposed to light, a change in the electrical conductivity is effectively suppressed.

That is, where an active layer is formed from amorphous silicon (a-Si), since a-Si becomes electrically conductive by the application of light, the characteristics of the switching element may be deteriorated. On the other hand, in the third preferred embodiment, since the active layer 28 is formed from a ZnO thin film having a band gap of about 3.3 eV and having transparency to visible light, even when the light is applied to the active layer 28, a change in the electrical conductivity is minimized, and deterioration of the characteristics of the switching element is prevented.

Furthermore, by integrally forming the TFT as an upper portion of a photoelectric conversion element or the LED shown in the first preferred embodiment, the amount of light incident to the photoelectric conversion element can be increased or the amount of light emitted from the light-emitting layer can be increased and, therefore, the proportion of opening is increased.

The present invention is not limited to the above-described preferred embodiments.

In the above-described preferred embodiments, the ZnO-based thin films are preferably formed by the ECR sputtering method. However, an inductively coupled plasma (ICP) sputtering method, a helicon wave excited plasma (HWP) sputtering method, an ion beam sputtering method, a cluster beam sputtering method, or other suitable sputtering method may be used. Alternatively, the ZnO-based thin films may be formed by a molecular-beam epitaxy (MBE) method, a metal organic chemical vapor deposition (MOCVD) method, a laser molecular-beam epitaxy (laser MBE) method, a laser abrasion method, or other suitable method other than the sputtering method.

Specific examples of the present invention will be described below.

The inventors of the present invention used the ECR sputtering apparatus, formed a ZnO thin film on a zinc-polar surface of a ZnO substrate, and prepared a test piece for Example. Furthermore, a ZnO thin film was formed on an oxygen-polar surface of a ZnO substrate, and a test piece for Comparative example was prepared.

That is, an ECR sputtering apparatus having a plasma generation chamber and a separate film formation chamber was provided. A ZnO substrate was disposed at a predetermined position in the film formation chamber, and the substrate was heated to a temperature of about 620° C.

Subsequently, each of 20 sccm of argon gas serving as a sputtering gas and 10 sccm of $O_2$ gas serving as a reaction gas was supplied to the plasma generation chamber, and microdischarge was performed, such that plasma was generated. A high-frequency electric field of about 150 W was applied to a sputtering target, and a sputtering treatment was performed, such that a Zno thin film was formed on a zinc-polar surface of a ZnO substrate, another ZnO thin film was formed on an oxygen-polar surface of another ZnO substrate and, thereby, test pieces for the Example and the Comparative example were prepared.

The inventors of the present invention observed the surface shapes of the ZnO thin films with an atomic force microscope.

Figure 7:
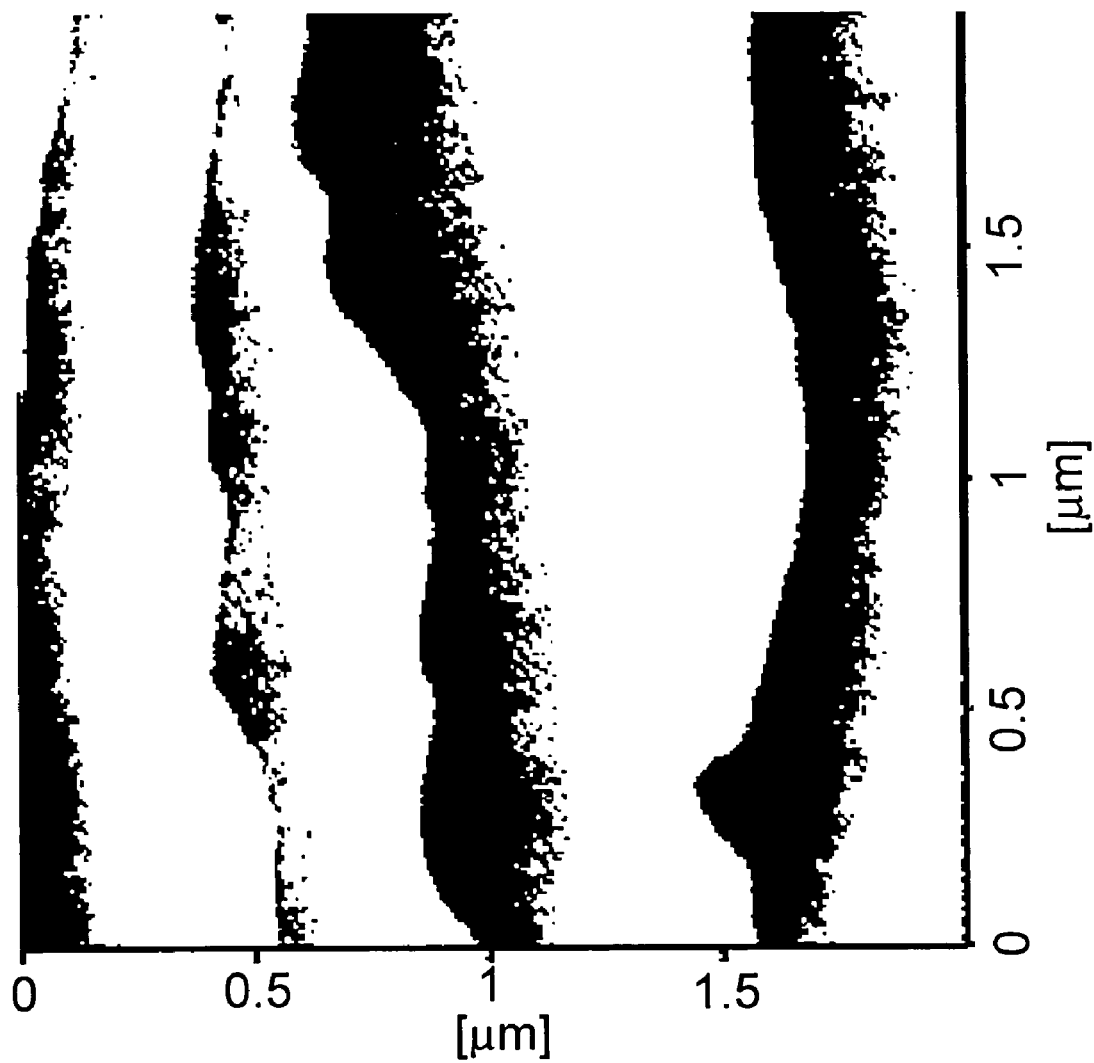
FIG. 7 is a micrograph showing the surface shape of a ZnO thin film formed on a zinc-polar surface of a ZnO substrate.
Figure 8:
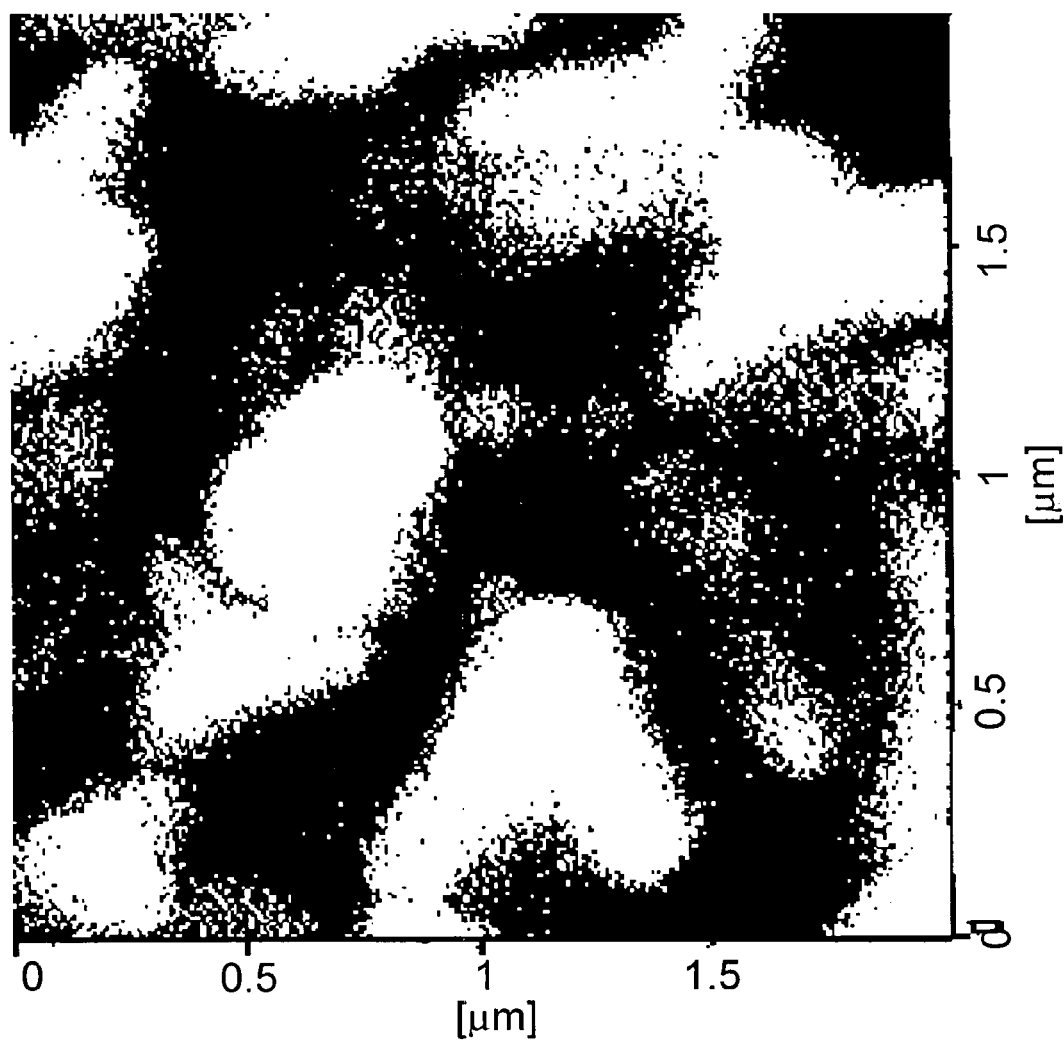
FIG. 8 is a micrograph showing the surface shape of a ZnO thin film formed on an oxygen-polar surface of the ZnO substrate.
Figure 9A:
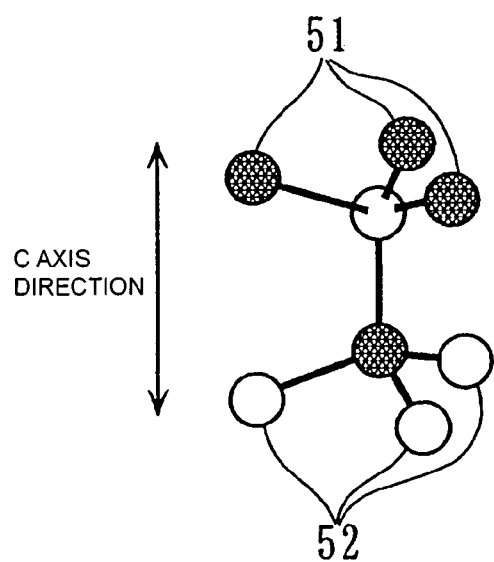
FIGS. 9A and 9B are diagrams showing a crystal structure of ZnO.
Figure 9B:
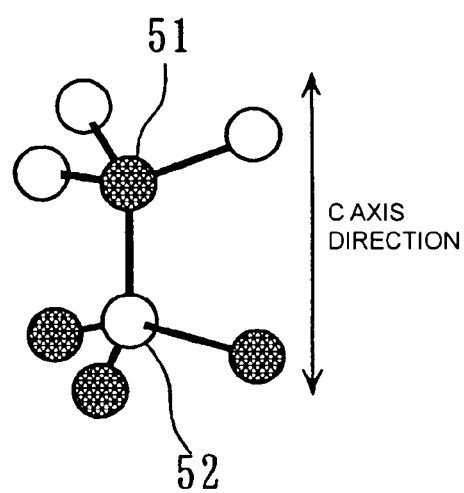

FIG. 7 shows the ZnO thin film of the Example. FIG. 8 shows the ZnO thin film of the Comparative example, formed on the oxygen-polar surface of the ZnO substrate.

As is clear from this FIG. 8, the ZnO thin film of the Comparative example is in the shape of islands and, therefore, grain boundaries are present.

On the other hand, as shown in FIG. 7, the ZnO thin film of the Example has a surface shape including a smooth terrace and a substantially linear step was obtained.

Therefore, it was clear that the ZnO thin film formed on the zinc-polar surface of the ZnO substrate had significantly improved surface smoothness as compared to that of the ZnO thin film formed on the oxygen-polar surface of the ZnO substrate.

The inventors of the present invention calculated the root-mean-square surface roughness RMS of the ZnO thin film, and evaluated the surface roughness.

As a result, the root-mean-square surface roughness RMS of the ZnO thin film of the Comparative example was about 20.4 nm, whereas the root-mean-square surface roughness RMS of the ZnO thin film of the Example was about 1.4 nm. Consequently, it was clear that the surface smoothness of the ZnO substrate was significantly improved by forming the ZnO thin film on the zinc-polar surface as compared to that in the case where the ZnO thin film was formed on the oxygen-polar surface.

The inventors of the present invention conducted a hole measurement, and calculated the electron mobility.

When the crystallinity is excellent, the mobility is increased because electrons are not scattered by crystal defects during movement. However, if crystal defects are present, the mobility is decreased because electrons are scattered by the crystal defects during movement.

Therefore, the level of crystallinity and the electric characteristics can be evaluated by calculating the electron mobility.

The inventors of the present invention sequentially laminated a Ti film and a Au film on each of the ZnO thin films of the Example and the Comparative example by an evaporation method to form an electrode, and conducted the hole measurement so as to measure the electron mobility.

The electron mobility was about 2 cm2/V·sec in the Comparative example, whereas the electron mobility was about 30 cm2/V·sec in the Example. Consequently, it was ascertained that both the crystallinity and the electric characteristics of the Example were greatly improved as compared to those of the Comparative example.

As described above, the electronic components according to preferred embodiments of the present invention are preferably used as components for image equipment, and are particularly suitable for use as light-emitting elements of optical pickups used in image equipment.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A semiconductor device comprising:
   a single crystal substrate primarily including zinc oxide and having a zinc-polar surface and an oxygen-polar surface; and at least one layer of thin film primarily including zinc oxide disposed on the zinc-polar surface; wherein the at least one layer of thin film includes a multilayer film and the multilayer film defines a light-emitting layer;

the multilayer film includes an n-type contact layer, an n-type clad layer, an active layer, a p-type clad layer and a p-type contact layer; and the n-type contact layer is a zinc oxide layer that is in contact with the zinc-polar surface of the single crystal substrate.

2. The semiconductor device according to claim 1, wherein the at least one layer of thin film has zinc-polarity.

3. The semiconductor device according to claim 1, further comprising a transparent electrode disposed on the multilayer film.

4. The semiconductor device according to claim 3, wherein the transparent electrode is made of Indium Tin Oxide.

5. A method for manufacturing a semiconductor device, comprising the steps of:

determining whether a surface of a single crystal substrate primarily including zinc oxide is a zinc-polar surface or an oxygen-polar surface; and forming at least one layer of thin film primarily including zinc oxide on the zinc-polar surface; wherein the at least one layer of thin film includes a multilayer film and the multilayer film defines a light-emitting layer;

the multilayer film includes an n-type contact layer, an n-type clad layer, an active layer, a p-type clad layer and a p-type contact layer; and the n-type contact layer is a zinc oxide layer that is in contact with the zinc-polar surface of the single crystal substrate.

6. The method for manufacturing a semiconductor device according to claim 5, wherein the thin film has zinc-polarity.

7. The method for manufacturing a semiconductor device according to claim 5, further comprising the steps of:

providing a sputtering apparatus provided with a plasma generation chamber and a separate film formation chamber; and performing sputtering treatment using the sputtering apparatus so as to form the thin film.

8. The method for manufacturing a semiconductor device according to claim 7, wherein the sputtering treatment is performed by a method selected from the group consisting of an electron cyclotron resonance plasma sputtering method, an inductively coupled plasma sputtering method, a helicon wave excited plasma sputtering method, an ion beam sputtering method, and a cluster beam sputtering method.

9. The method for manufacturing a semiconductor device according to claim 5, wherein the thin film is formed by a method selected from the group consisting of a molecular-beam epitaxy method, a metal organic chemical vapor deposition method, a laser molecular-beam epitaxy method, and a laser abrasion method.

* * * * *